United States Patent [19]

Merjanian

[11] Patent Number: 5,110,098

[45] Date of Patent: May 5, 1992

[54] UNIVERSAL PLATEN HOLDDOWN APPARATUS

[75] Inventor: John-Michael Merjanian, Burlington, Mass.

[73] Assignee: W. R. Grace & Co.-Conn., New York, N.Y.

[21] Appl. No.: 559,441

[22] Filed: Jul. 26, 1990

Related U.S. Application Data

[63] Continuation of Ser. No. 397,355, Aug. 21, 1989, abandoned, which is a continuation of Ser. No. 250,029, Sep. 27, 1988, abandoned.

[51] Int. Cl.$^5$ .............................................. B25B 11/00
[52] U.S. Cl. ........................................ 269/21; 269/71
[58] Field of Search ....................... 269/21, 57, 58, 71, 269/289 R; 51/235

[56] References Cited

U.S. PATENT DOCUMENTS 2,691,937 10/1954 Emerson ................................. 269/21
4,183,545 1/1980 Daly ....................................... 269/21

FOREIGN PATENT DOCUMENTS 584752 9/1933 Fed. Rep. of Germany ........ 269/21
56-33247 4/1981 Japan ..................................... 269/58

Primary Examiner—J. J. Hartman
Attorney, Agent, or Firm—John J. Wasatonic; William L. Baker

[57] ABSTRACT

Disclosed is a universal platen holddown apparatus that includes a first plate rotatable about its central axis, and a second plate that is rotatable about its own central axis. The first plate is mounted within the second plate so that rotation of the second plate results in the eccentric rotation of a vacuum suction cup 14 mounted at or near a rim of the first plate. This arrangement allows the suction cup to be moved to any location within the boundaries of the second plate.

9 Claims, 3 Drawing Sheets

UNIVERSAL PLATEN HOLDDOWN APPARATUS

This is a continuation of application Ser. No. 397,355 filed on Aug. 21. 1989, which is a continuation of application Ser. No. 250,029, filed on Sep. 27, 1988, both now abandoned.

BACKGROUND OF THE INVENTION

The present invention relates to an apparatus for holding a workpiece, and more particularly to an apparatus for vacuum holding a printed circuit board substrate of any shape or size.

During the manufacture of printed circuit boards in which a printed circuit board substrate is exposed to ultraviolet light, the substrate must be securely positioned on a work surface. One type of holding apparatus secures the substrate on a work table by applying vacuum through the work table. The vacuum, however, does not always provide an effective hold, especially if the surfaces of the substrate are not perfectly flat. For example, warped circuit board substrates do not lie flat on a work table, and as a result vacuum holding ability is less than optimal. In addition, the circuit board substrates often contain through holes which prevent the vacuum holddown of the substrate.

Another common problem encountered with the use of existing holddown apparatus is that they are designed to handle a workpiece of a single preset size, and it is often necessary to process a variety of printed circuit boards substrate sizes. U.S. Pat. No. 4,468,017 describes one type of vacuum holddown apparatus that is designed to handle a variety of workpiece sizes by utilizing a vacuum zone control valve for selectively applying vacuum to certain regions on the table. One disadvantage of such a system is that the location of the vacuum source on the work table is preset and can not be moved to a location where the vacuum holding power can more efficiently operate on the workpiece.

It is therefore a principal object of the present invention to provide a vacuum holddown apparatus that will hold a printed circuit board substrate having an uneven surface.

It is another object of the present invention to provide a vacuum holddown apparatus that will hold a variety of different sizes of printed circuit board substrates.

SUMMARY OF THE INVENTION

The universal platen holddown apparatus of the present invention includes a first plate that is rotatable about its central axis, and a second plate that is rotatable about its own central axis. The first plate is mounted within the second plate so that rotation of the second plate results in the eccentric rotation of a vacuum suction cup 14 mounted near the rim of the first plate. This arrangement allows the suction cup to be moved to virtually any location within the boundaries of the second plate.

By arranging a plurality of the two-plate assemblies, vacuum suction can be applied to different locations on a workpiece. In a preferred embodiment, the plate assemblies are arranged so that the workpiece is held at each of its four corners and in one or more central locations.

These and other objects and features of the present invention will become more clearly understood from the following detailed description which should be read in light of the accompanying drawings in which corresponding reference numerals refer to corresponding parts throughout the several views.

DETAILED DESCRIPTION OF THE PREFERRED EMBODIMENT

Figure 1:
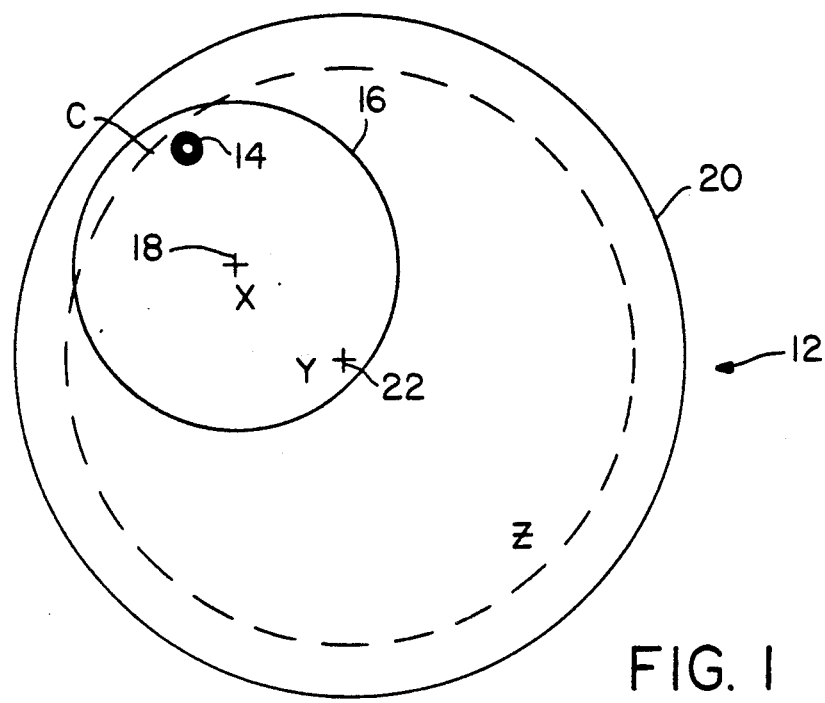
FIG. 1 is a top plan view of a single disc assembly of a universal platen holddown apparatus of the present invention.

Referring to FIG. 1, a universal platen holddown apparatus 10 of the present invention includes at least one disc or plate assembly 12. Each disc assembly includes a bellow style vacuum cup 14 mounted on the rim of a circular plate 16. Circular plate 16 is mounted for rotation about its central axis 18, and a second larger circular plate 20 is mounted for rotation about its own central axis 22. Rotation of the second circular plate 20 causes the eccentric rotation of plate 16 about axis 22.

The two flat plates 16, 20 are embedded in a platen or table 24 to provide complete support for the workpiece on a level image plane as is needed to provide a support for the substrate. Without requiring deep slots in the platen 24, the suction cup 14 can move radially (between circumference Z and point Y) in relation to large plate 20 by rotating small plate 16. The cup 14 can also be moved angularly about axis 22 so that the cup has full motion in the area of the large circle defined by circumference Z, which, as shown in FIG. 1, circumscribes an area covering a majority of the total area of the large plate 20. The vacuum is carried through the disc assembly 12 connecting at the axis 22 of the plate 20 to plate 16 as will be described below with reference to FIGS. 3-5.

Figure 2:
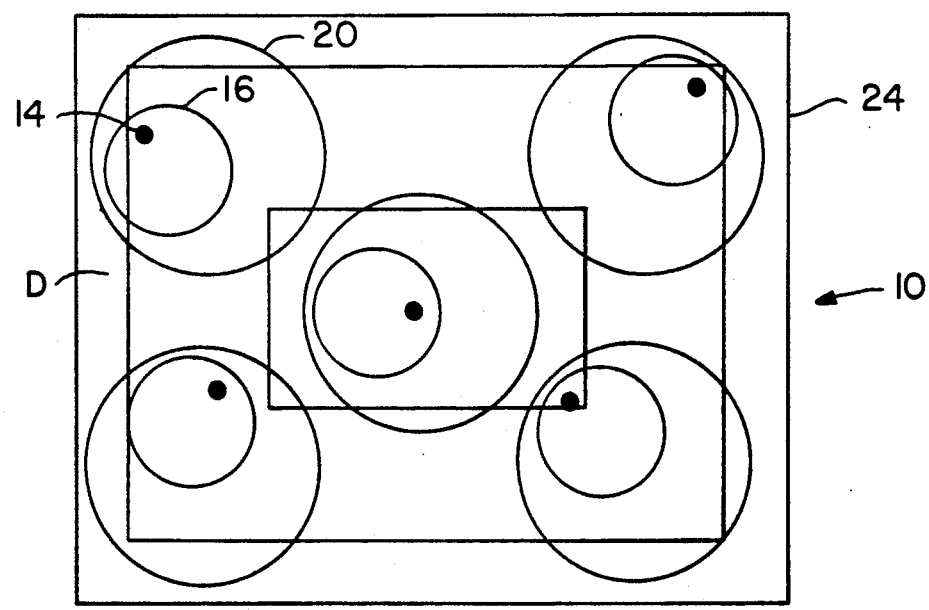
FIG. 2 is a top plan view of a platen assembly including five of the disc assemblies shown in FIG. 1.

Referring to FIG. 2, the five disc assemblies 12 are arranged on a single work table 24 to provide holddown vacuum source in the center and at the four corners of a workpiece, the perimeter of which falls within the area D outlined in the figure. When a void is located that would prevent a vacuum to occur, a fine adjustment of the plates provides a suction cup placement at the appropriate location.

Figure 3:
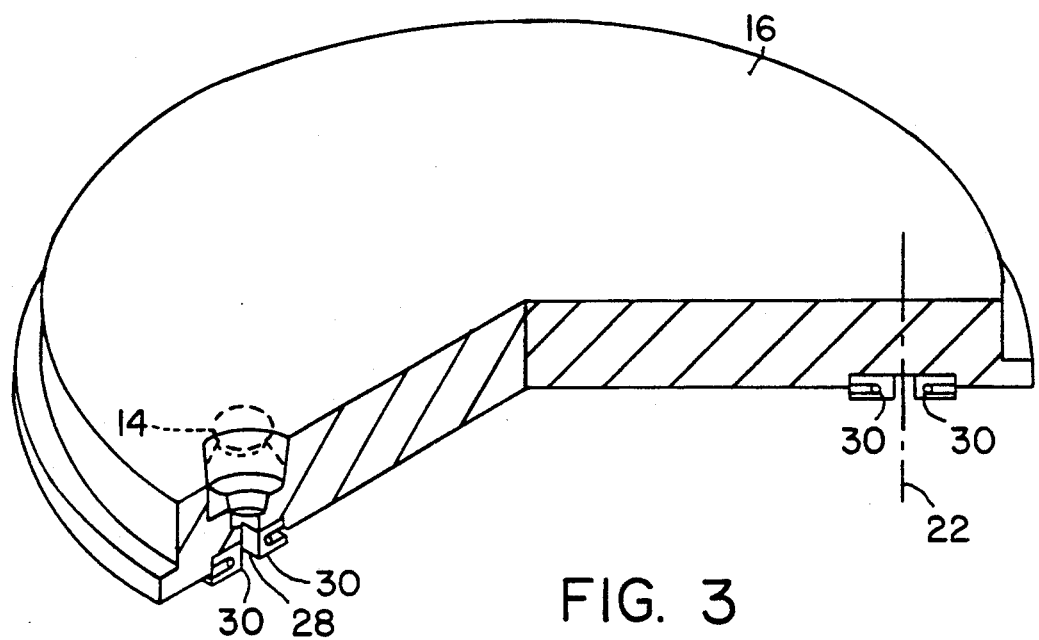
FIG. 3 is a top perspective view, with a portion cut out, of the smaller disc of the disc assembly shown in FIG. 1.
Figure 4:
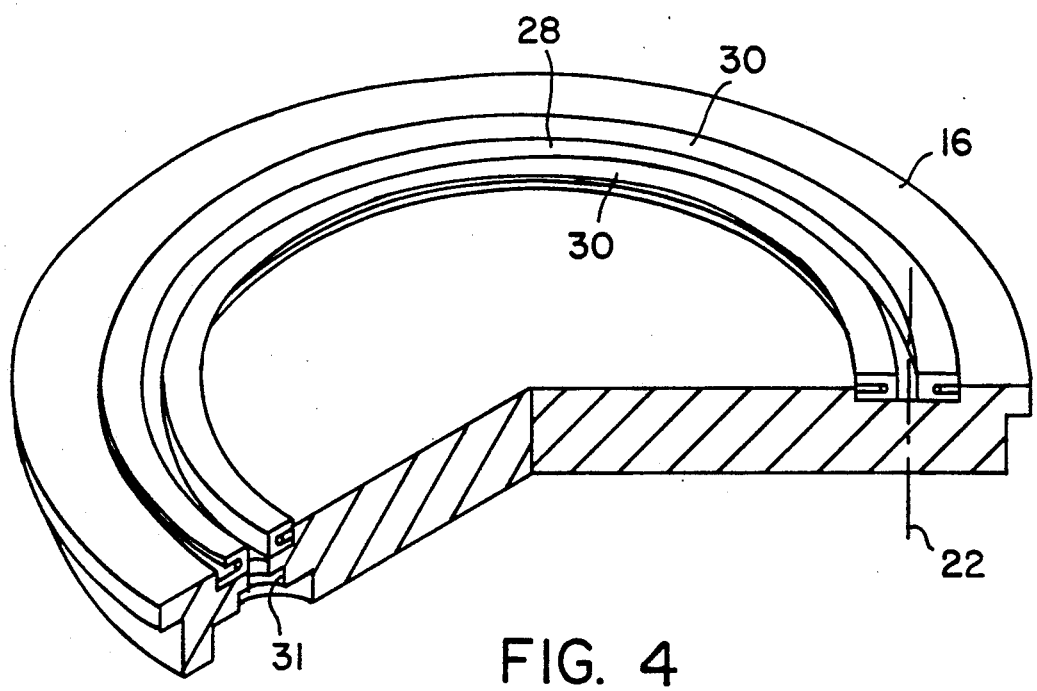
FIG. 4 is a bottom perspective view of the disc shown in FIG. 3.
Figure 5:
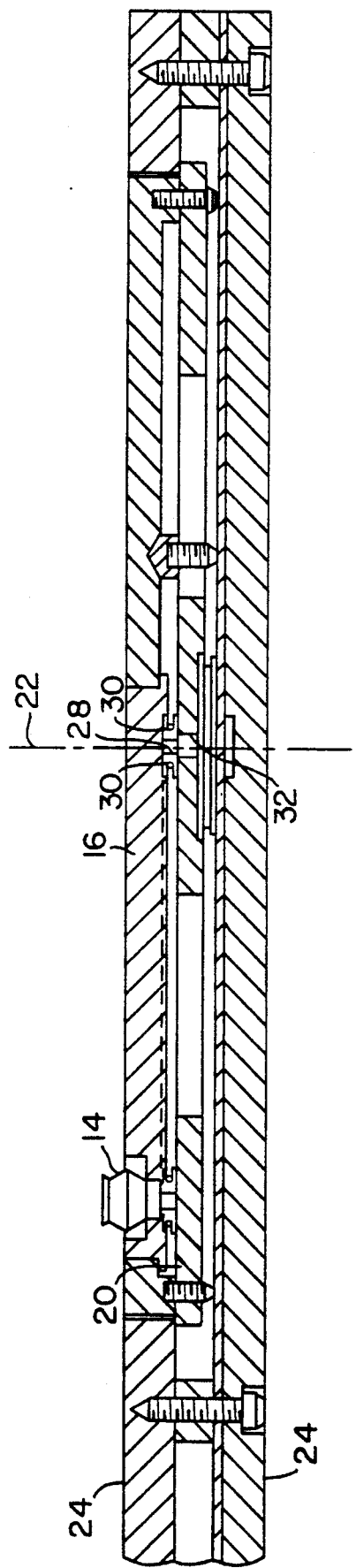
FIG. 5 is a side elevational view of a portion of the universal holddown apparatus shown in FIG. 1, including the disc shown in FIGS. 3 and 4.

Referring now to FIGS. 3-5, each circular plate 16 includes a narrow circular channel 28 between two seals 30. The suction cup 14 is positioned over channel 28 so that the lower end of the suction cup communicates with an opening 31 through the plate 16 to the channel 28. A vacuum source is applied to channel 28 through nozzle 32 which communicates with channel 28 from below circular plate 16. Nozzle 32 is aligned with axis 22 and remains aligned with axis 22 when the circular plates 16 or 20 rotate. Channel 28 is sealed on the underside of plate 16 and the top of circular plate 20.

While the foregoing invention has been described with reference to its preferred embodiments, various alterations and modifications will occur to those skilled in the art. All such alterations and modifications are intended to fall within the scope of the appended claims.

What is claimed is:

1. An apparatus for securely holding a workpiece on a table through the application of a vacuum source through the table, said apparatus comprising:
   a first plate rotatable about its central axis;
   a second plate mounted on said table and rotatable about its central axis, said second plate being larger than said first plate and entirely encircling said first plate which is mounted on said second plate;
   means for applying a vacuum source to a workpiece through an opening in said first plate located at or near the outer perimeter of said first plate; wherein the rotation of said first and second plates about their central axes can be used to position said means for applying a vacuum at any point within a circumferential area on said second plate covering a majority of the total area of said second plate.

2. The apparatus for holding a workpiece of claim 1 wherein said first plate is mounted at a location on said second plate so that said first plate rotates in an eccentric fashion about the axis of rotation of said second plate.

3. The apparatus for holding a workpiece of claim 1 wherein a top surface of said first plate is flush with a top surface of said table.

4. The apparatus for holding a workpiece of claim 1 wherein said means for applying a vacuum source comprises means for connecting a vacuum source to said first plate along the axis of rotation of said second plate.

5. The apparatus for holding a workpiece of claim 1 comprising a plurality of said first and second plates.

6. The apparatus for holding a workpiece of claim 1 wherein said means for applying a vacuum source comprises a suction cup mounted at or near the outer perimeter of said first plate.

7. The apparatus for holding a workpiece of claim 1 wherein said first plate is rotatable 360° about its axis and said second plate is rotatable 360° about its axis.

8. The apparatus for holding a workpiece of claim 1 wherein said first plate comprises:
   a channel formed between two seals positioned along a bottom surface of said first plate, said channel communicating with the upper side of said first plate through an opening through said first plate extending from said channel to the top surface of said first plate;
   means for sealing said channel;
   means for applying a vacuum source to said channel and through said opening.

9. The apparatus for holding workpiece of claim 8 further comprising a suction cup positioned within said first plate in communication with said opening.

* * * * *